(12) United States Patent
Sakane et al.

(10) Patent No.: US 7,356,454 B2
(45) Date of Patent: Apr. 8, 2008

(54) METHOD AND APPARATUS FOR EMULATION OF LOGIC CIRCUITS

(75) Inventors: Hirofumi Sakane, Newark, DE (US);
 Levent Yakay, Elkton, MD (US);
 Vishal Karna, Newark, DE (US);
 Clement Leung, Reston, VA (US);
 Guang R. Gao, Newark, DE (US)

(73) Assignee: UD Technology Corporation, Newark, DE (US)

( * ) Notice: Subject to any disclaimer, the term of this patent is extended or adjusted under 35 U.S.C. 154(b) by 478 days.

(21) Appl. No.: 10/967,814

(22) Filed: Oct. 18, 2004

(65) Prior Publication Data

US 2005/0154577 A1 Jul. 14, 2005

Related U.S. Application Data

(60) Provisional application No. 60/512,376, filed on Oct. 17, 2003.

(51) Int. Cl.
 *G06F 9/455* (2006.01)
(52) U.S. Cl. .............................. 703/23; 703/28; 703/25; 703/16; 716/4; 716/16; 714/710
(58) Field of Classification Search .................. 703/23, 703/25, 16, 28, 26; 716/16, 4; 714/710
 See application file for complete search history.

(56) References Cited

U.S. PATENT DOCUMENTS

| | | | |
|---|---|---|---|
| 5,309,444 A * | 5/1994 | Dartois et al. ............... | 714/710 |
| 5,551,013 A | 8/1996 | Beausoleil et al. | |
| 5,581,742 A * | 12/1996 | Lin et al. ......................... | 716/4 |
| 5,596,742 A * | 1/1997 | Agarwal et al. ............... | 716/16 |
| 5,841,967 A | 11/1998 | Sample et al. | |
| 5,850,537 A | 12/1998 | Selvidge et al. | |
| 5,872,953 A * | 2/1999 | Bailey .......................... | 703/16 |
| 5,960,191 A | 9/1999 | Sample et al. | |
| 6,298,319 B1 * | 10/2001 | Heile et al. .................... | 703/26 |
| 6,377,911 B1 | 4/2002 | Sample et al. | |
| 6,377,912 B1 | 4/2002 | Sample et al. | |
| 6,404,224 B1 | 6/2002 | Azegamie et al. | |
| 6,618,698 B1 | 9/2003 | Beausoleil et al. | |
| 7,130,787 B1 * | 10/2006 | Noury et al. .................. | 703/28 |
| 2002/0161568 A1 * | 10/2002 | Sample et al. ................ | 703/25 |
| 2003/0212539 A1 * | 11/2003 | Beausoleil et al. ........... | 703/25 |

FOREIGN PATENT DOCUMENTS

DE 101 42 553 A1 4/2003

OTHER PUBLICATIONS

Young et al., "Generation of universal series-parallel Boolean functions", ACM 1999.*

* cited by examiner

*Primary Examiner*—K. Thangavelu
(74) *Attorney, Agent, or Firm*—RatnerPrestia

(57) ABSTRACT

A method for emulating a logic circuit having at least one set of identical logic modules is disclosed. Each logic module in a set has logic elements and memory elements that store a module state of that logic module. The logic circuit is emulated by extracting a logic module from a set of identical logic modules, translating the extracted logic module for iterative representation of the module state of each of the logic modules with a single instance of the logic elements, and configuring a logic device with the translated logic module to emulate the logic circuit.

19 Claims, 8 Drawing Sheets

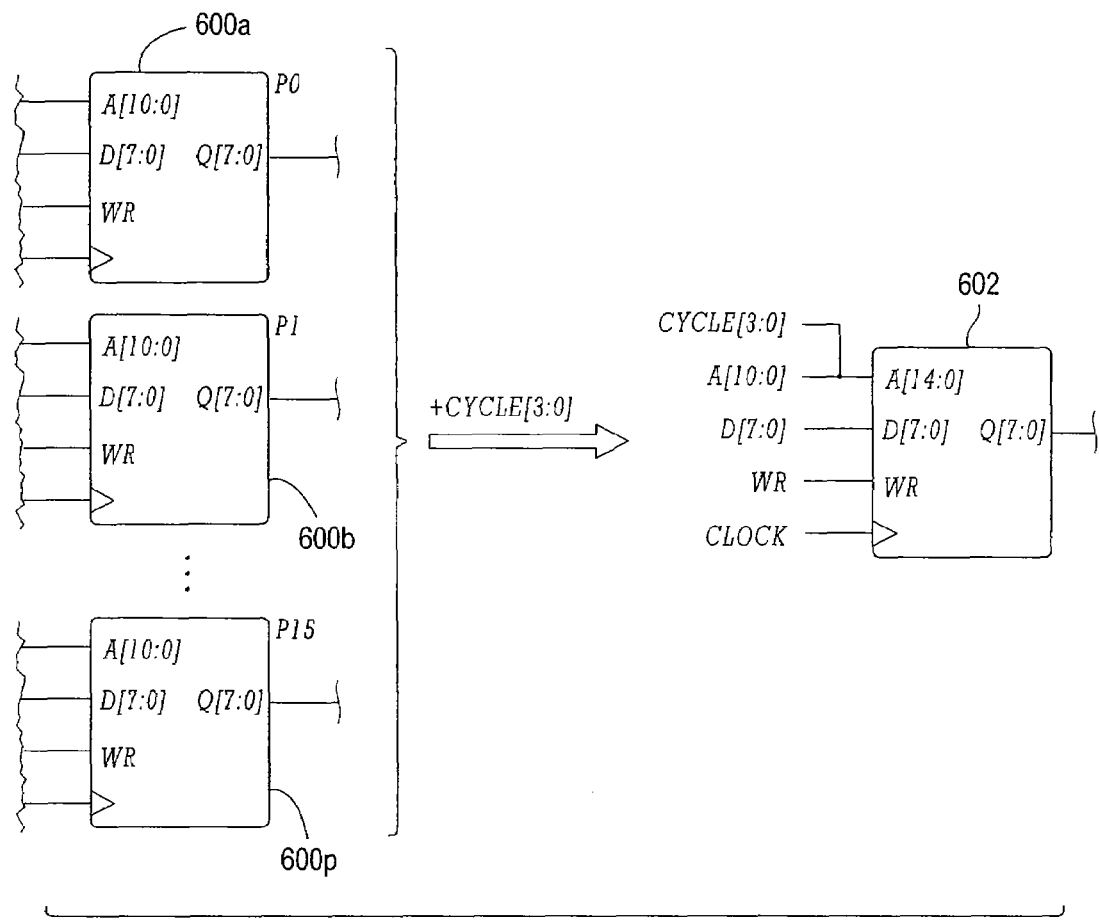
FIG. 6
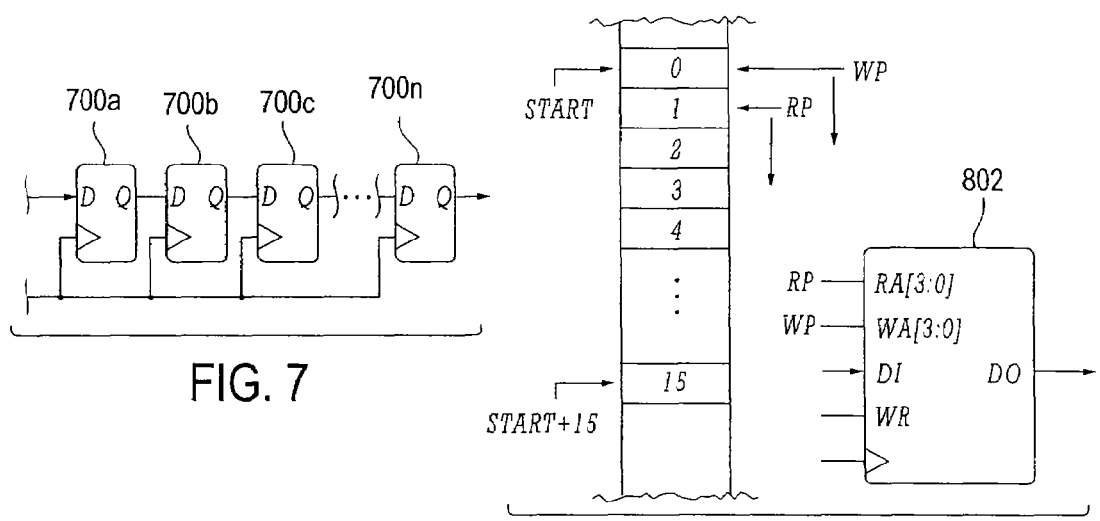
FIG. 7
FIG. 8

METHOD AND APPARATUS FOR
EMULATION OF LOGIC CIRCUITS

CROSS REFERENCE TO RELATED APPLICATIONS

This application claims the benefit of the filing date of provisional application No. 60/512,376 entitled "METHOD AND APPARATUS FOR ITERATIVE EMULATION OF LARGE LOGIC CIRCUITS CONTAINING MULTIPLE IDENTICAL LOGIC MODULES" filed Oct. 17, 2003, the contents of which are incorporated herein by reference.

STATEMENT REGARDING FEDERALLY SPONSORED RESEARCH

This invention was made with support from the United States Government National Security Agency under Contract Number MDA904-03-R-1148.

FIELD OF THE INVENTION

The present invention relates to logic circuit emulation and, more particularly, to methods and apparatus for emulating large logic circuits having identical logic modules.

BACKGROUND OF THE INVENTION

Logic circuit emulation (or hardware emulation) may be used to verify logic circuit designs. In general, a logic circuit emulation of a designed logic circuit enables verification that the designed logic circuit functions correctly at higher speeds than a logic simulation in software is capable of providing. In addition, logic circuit emulations enable higher cycle level accuracy than instruction level simulations in software.

In a typical logic circuit emulation, the logic circuit is emulated in a limited amount of configurable logic emulation resources such as a field programmable gate array (FPGA). These logic emulation resources tend to be expensive, with larger logic circuits requiring more logic emulation resources.

There is an ever present desire to reduce costs associated with the development of logic circuits. Emulation of logic circuit designs for design verification during the development of logic circuits contributes to the overall cost associated with the development of logic circuits. Accordingly, methods and apparatus are needed for reducing the cost associated with the emulation of logic circuits. The present invention addresses this need among others.

SUMMARY OF THE INVENTION

The present invention is embodied in methods and apparatus for emulating a logic circuit having at least one set of identical logic modules. Each logic module in a set has at least one logic element and at least one memory element that stores a module state of that logic module. The logic circuit is emulated by extracting a logic module from a set of identical logic modules, translating the extracted logic module for iterative representation of the module state of each of the identical logic modules with a single instance of the at least one logic element, and configuring a logic device with the translated logic module to emulate the logic circuit.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. The letter "n" may represent a non-specific number of elements. This emphasizes that according to common practice, the various features of the drawings are not drawn to scale. On the contrary, the dimensions of the various features are arbitrarily expanded or reduced for clarity. Included in the drawings are the following figures:

FIG. 6 is a block diagram depicting translation of memory arrays into a united memory array in accordance with an aspect of the present invention;

FIG. 7 is a block diagram depicting a cascaded series of flip-flops that function as a shift register in accordance with an aspect of the present invention;

FIG. 8 is a block diagram depicting a ring buffer that functions as a shift register in accordance with an aspect of the present invention;

DETAILED DESCRIPTION OF THE INVENTION

Figure 1A:
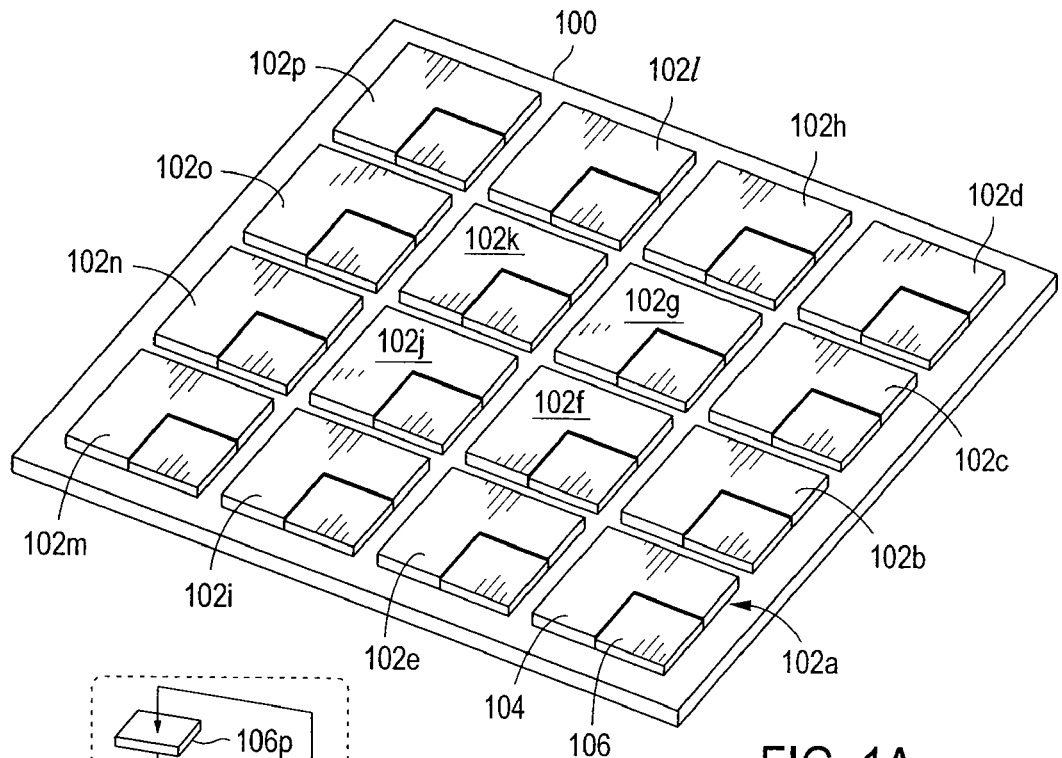
FIG. 1A is a perspective view of a prior art logic circuit.

FIGS. 1A, 1B, 2A, and 2B are useful for providing an overview of the present invention. FIG. 1A depicts a logic circuit 100 including a set of identical logic modules (e.g., sixteen logic modules 102a-p in the illustrated embodiment) and an exploded view of one of the logic modules (e.g., 102a). Each logic module 102 includes logic elements 104 and memory elements 106 that store values (states) for use by the logic elements 104. The logic elements 104 may include, by way of non-limiting example, logic circuits such as inverters, AND Gates, and OR gates. The memory elements 106 may include, by way of non-limiting example, flip-flops and/or memory arrays.

Figure 1B:
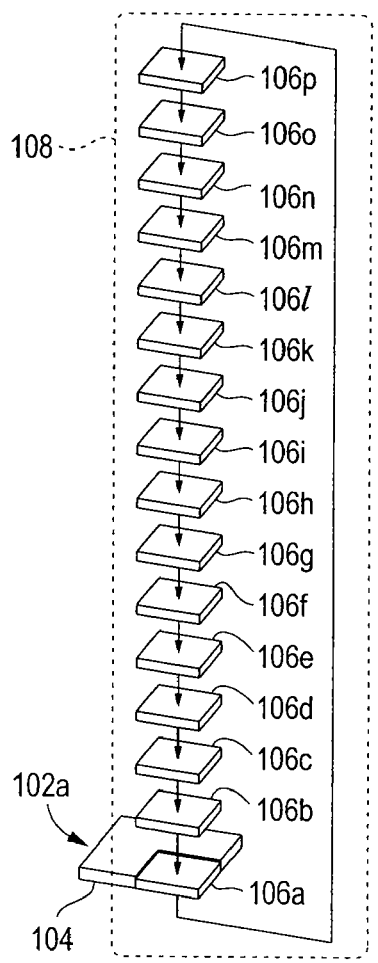
FIG. 1B is a perspective view of a conceptual representation of the logic circuit of FIG. 1A in accordance with an aspect of the present invention.

The logic elements 104 receive input parameter values (states) and produce output parameter values (states) based solely on the input parameter values. These input and output parameter values are stored in the memory elements 106. Since the output parameter values produced by the logic elements 104 are based solely on the input parameter values (which are stored in the memory elements 106), the logic elements 104 of a single logic module can produce the output parameter values for each logic module within the set of identical logic modules by iteratively combining those logic elements with the input parameter values (states) stored in the memory elements of each logic module as depicted in FIG. 1B. The output parameter values (states) produced by the logic elements 104 of a single logic module may be iteratively stored in the memory elements of each logic module. Emulating the set of identical logic modules with one instance of the logic elements 104 reduces emulation resource requirements and, thus, costs associated with emulation of logic circuit designs.

Figure 2A:
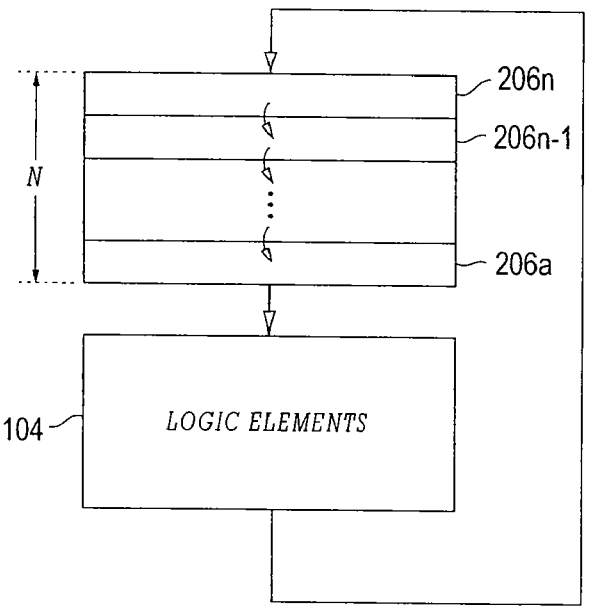
FIG. 2A is a conceptual representation of a logic circuit in accordance with an aspect of the present invention.

FIG. 2A depicts a conceptual iterative representation of a logic circuit 100 (FIG. 1) in accordance with an aspect of the present invention. In FIG. 2A, there are N logic modules 102 (FIG. 1) in a set of identical logic modules and the state of each logic module 102 (i.e., values within memory elements 106 of the logic modules in FIG. 1) is portrayed by state vectors (represented by state vectors 206a-n in the illustrated embodiment). The state vectors 206 include the states of all memory elements 106, e.g., states of programmable register files, memory blocks, and controls, retained in the memory elements 106 for use by the logic elements 104 from cycle-to-cycle. As described in further detail below, a configurable logic device is configured with the logic elements and embedded memory resources within the configurable logic device (as well as additional external memory resources) may be used to store the state vectors representing the states of the memory elements 106. The embedded memory approach may have wider bandwidth while the external memory approach may have essentially unlimited capacity.

Figure 2B:
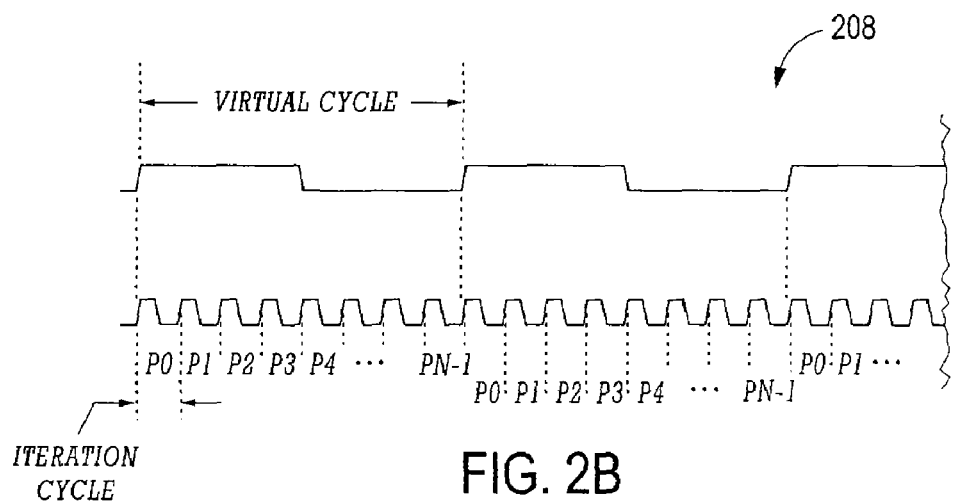
FIG. 2B is a timing diagram for the conceptual logic circuit of FIG. 2A.

FIG. 2B depicts a timing diagram 208 for the logic circuit representation of FIG. 2A. A configured logic device has an operating frequency with a corresponding cycle (referred to herein as an iteration cycle). In an exemplary embodiment, each is cycle of the logic device corresponds to one iteration of the logic module. Thus, representation of a set of N logic modules requires N iterations ($P_0$- $P_{N-1}$), referred to herein as a virtual cycle. Each virtual cycle represents a complete emulation of the set of identical logic modules. To emulate the logic circuit iteratively, the memory elements of each identical logic module is shifted and replaced cycle-by-cycle so that the logic elements of the logic module receive previous states and produce the next states for storage in the memory elements for the next virtual cycle.

Figure 3:
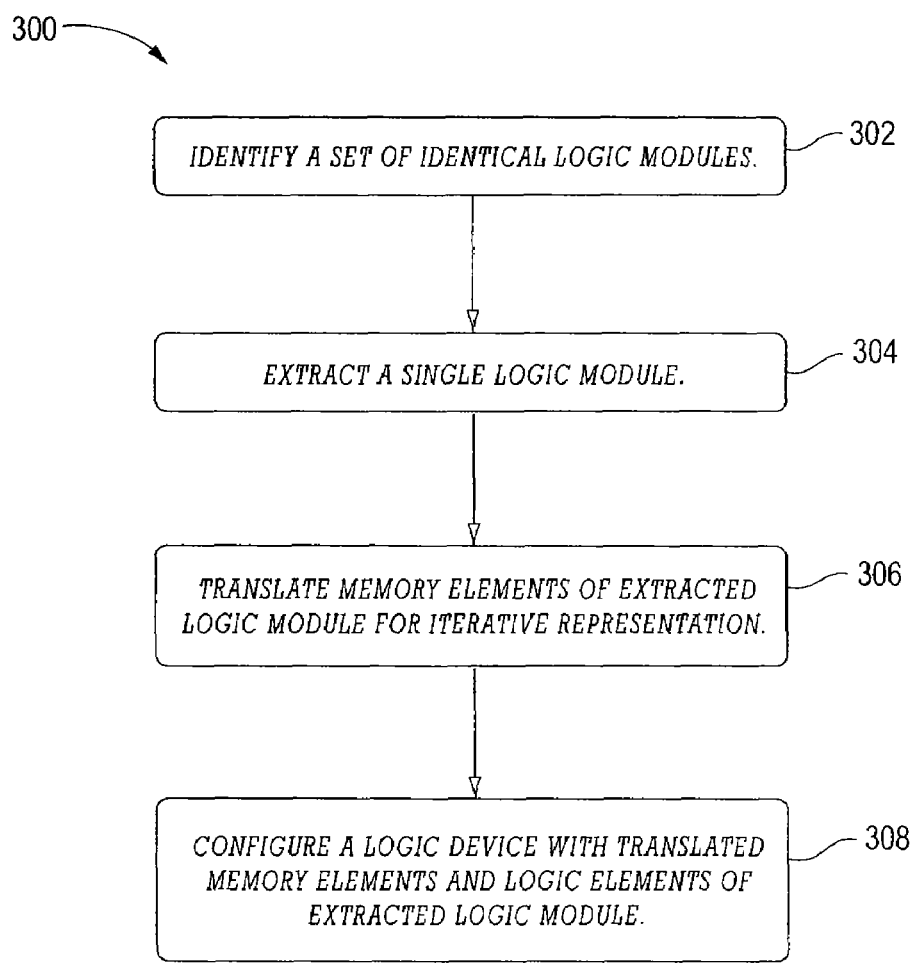
FIG. 3 is a flow chart of exemplary steps for emulating a logic circuit in accordance with an aspect of the present invention.

FIG. 3 depicts a flow chart 300 of exemplary steps for emulating a logic circuit in accordance with an aspect of the present invention. The logic circuit includes at least one set of identical logic modules. In an exemplary embodiment, the logic circuit is a multiprocessor system on a chip (MpSOC). Although the present invention is described below with reference to an MpSOC logic circuit, the invention also applies to more general logic designs containing identical logic modules. Logic modules within the set of identical logic modules may be general purpose processors, hardware accelerator modules (HAM; such as a DSP, image processor, audio processor or encryption engine), or components in an interconnection network. A single logic circuit design may include more than one set of identical logic modules.

At block 302, a set of identical logic module is identified within the logic circuit. In an exemplary embodiment, the set of identical logic modules is identified manually. In an alternative exemplary embodiment, the set of identical logic modules may be identified automatically, e.g., from a hardware description language (HDL) file representing the logic circuit. The design of the logic circuit may be in a register transfer level (RTL) representation having a structural description in which each flip-flop and/or shift register is instantiated as a sub-component and are connected to each other in a higher layer to simplify the translation processes described below.

At block 304, a logic module is extracted from the set of identical logic modules. In an exemplary embodiment, the extracted logic module may be the first instance of a logic module in the identified set of identical logic modules, but may be any logic module within the set. The logic module may be extracted from the HDL file representing the logic circuit.

At block 306, the extracted logic module is translated for iterative representation of the module state of each logic module within the set of identical logic modules with a single instance of the at least one logic element. For example, as described in further detail below, flip-flops within the memory elements may be replaced with shift registers and memory arrays may be united within a larger memory array. In an exemplary embodiment, translation is performed on the HDL file representing the logic circuit in a manner that will be understood by one of skill in the art from the description herein.

At block 308, a logic device is configured with the translated logic module. In an exemplary embodiment, the logic device is a reconfigurable logic device such as a field programmable gate array (FPGA). Configuration of the logic circuit may be accomplished in a manner that will be understood by one of skill in the art from the description herein using the HDL file representing the logic circuit after extraction and translation of the logic module.

Figure 4A:
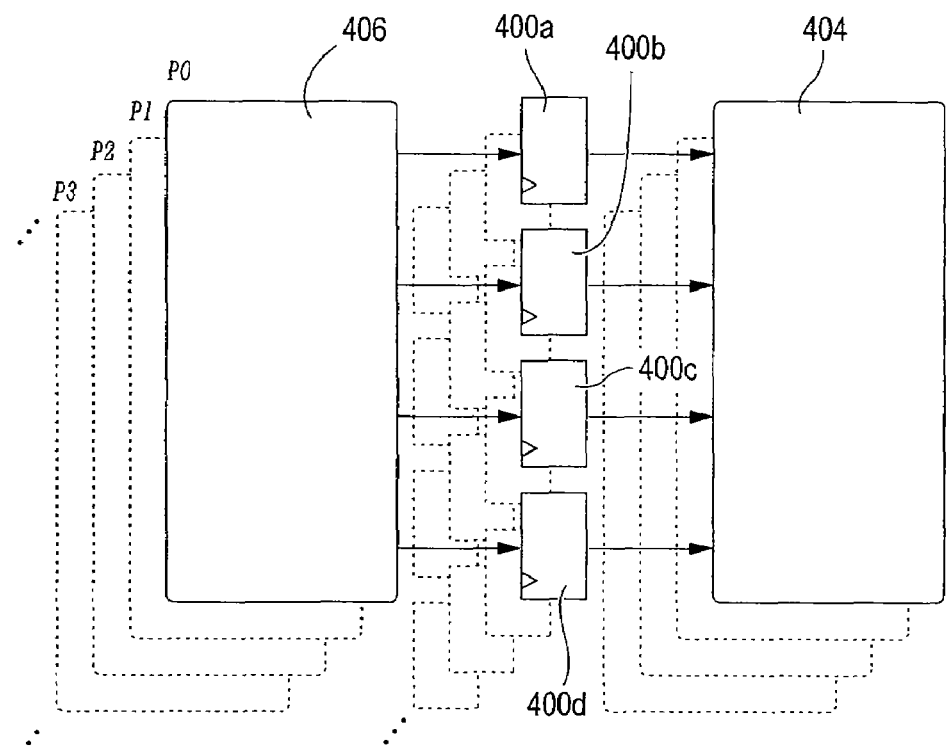
FIG. 4A is a block diagram depicting flip-flops prior to translation in accordance with an aspect of the present invention.
Figure 4B:
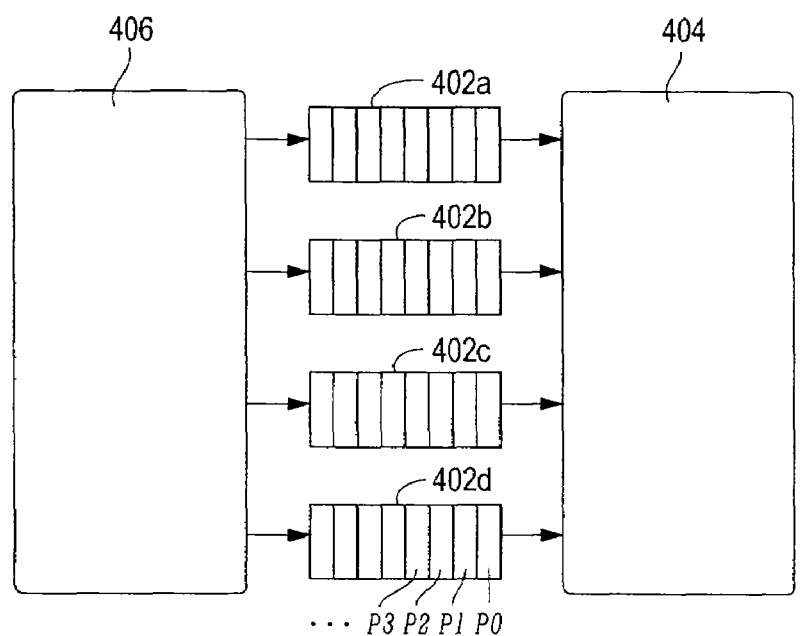
FIG. 4B is a block diagram depicting flip-flops after translation in accordance with the present invention.

Additional implementation details are now described. FIGS. 4A and 4B are useful for describing how the operation of the memory element flip-flops (represented by flip-flops 400a-d) is retained after translation into shift registers (represented by shift registers 402a-d). The flip-flops 400 store values, e.g., for use by logic elements 104. Each shift register 402 represents corresponding flip-flops from each logic module in the set of identical logic modules. Thus, if there are N logic modules in the set, an N-bit shift register is used. The shift registers provide a state bit produced in the last iteration of the logic module to a logic element 404 and receives another state bit just produced in the current iteration cycle as a next state bit from another logic element 406.

The new state bit remains in the shift register 402 until the next iteration for the same logic module. Adjacent bits in the shift register 402 correspond to different logic modules.

Figure 5A:
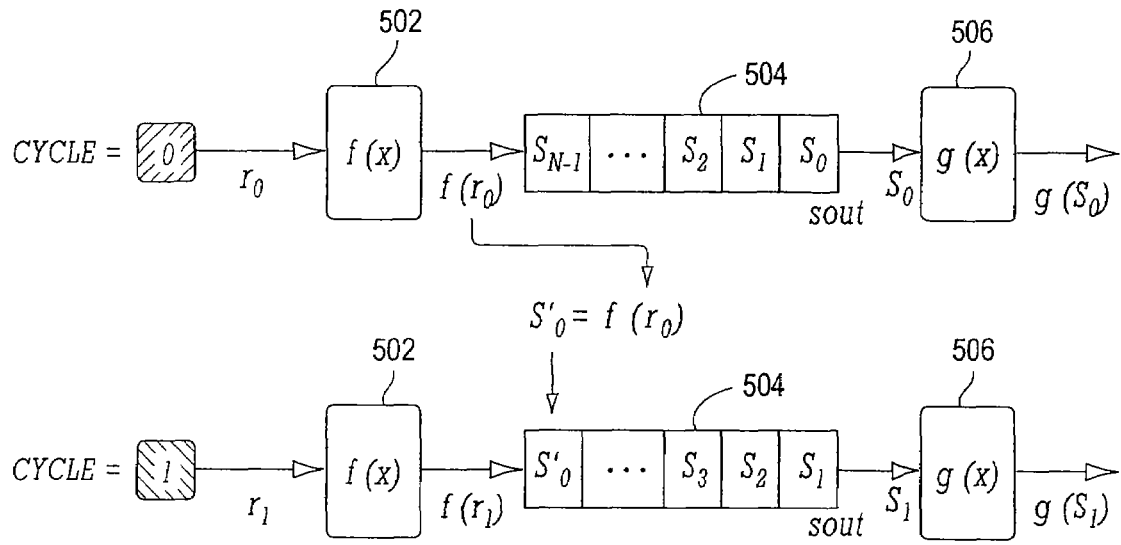
FIG. 5A is a block diagram depicting two consecutive iteration cycles for a logic circuit translated in accordance with the present invention.
Figure 5B:
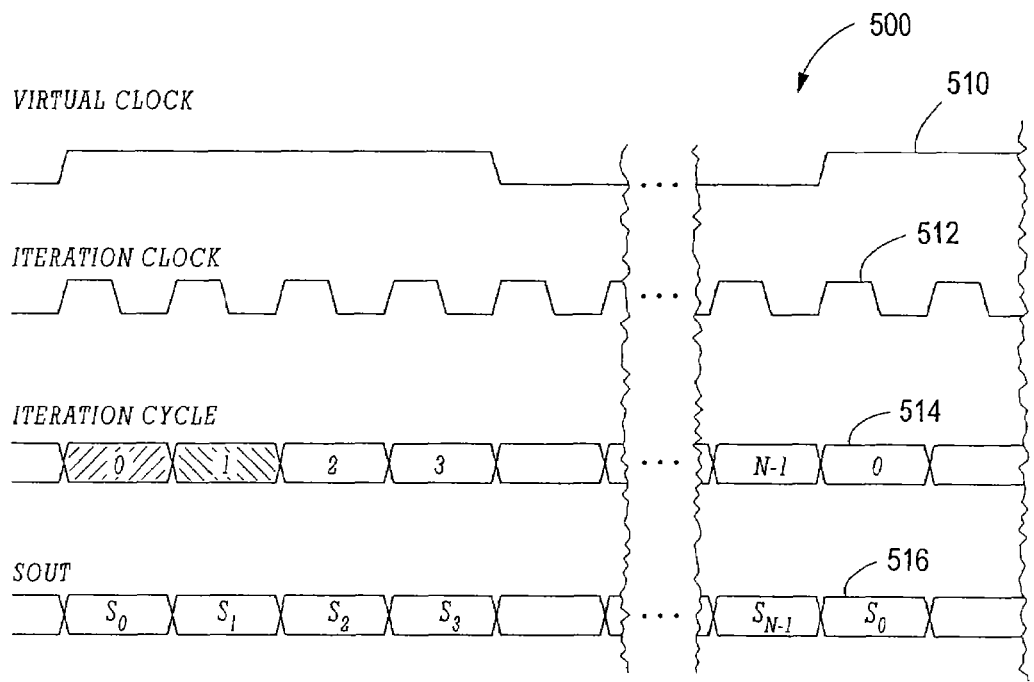
FIG. 5B is a timing diagram for the iteration cycles depicted in FIG. 5A.

FIG. 5A depicts two consecutive iteration cycles (cycle 0 and cycle 1) that represent processing within a first logic module and a second logic module, respectively, and FIG. 5B depicts a corresponding timing diagram 500. In cycle 0, a first logic element 502 receives $r_0$ at an input port and produces $f(r_0)$ at an output port. A shift register 504 receives $f(r_0)$ at the end of the iteration cycle and concurrently produces so at an output port, which was received by the shift register 504 N cycles before. A second logic element 506 receives $s_0$ at an input port and produces $g(s_0)$ at an output port. During cycle 0, the first and second logic elements 502 and 506 behave as part of a first logic module.

In cycle 1, the first logic element 502 receives $r_1$ and produces $f(r_1)$. During cycle 1, the value produced by the first logic element 502 during cycle 0 is in a first bit position of the shift register 504 (i.e., $s'_0$) for use by the second logic element 506 N−1 cycles later. The shift register 504 receives $f(r_1)$ at the end of the iteration cycle and concurrently produces $s_1$ at an output port, which was received by the shift register 504 N cycles before. The second logic element 506 receives $s_1$ at an input port and produces $g(s_1)$ at an output port. During cycle 1, the first and second logic elements 502 and 506 behave as part of a second logic module.

The timing diagram 500 of FIG. 5B depicts a virtual clock signal 510, an iteration clock signal 512, an iteration cycle signal 514, and an output signal ($s_{out}$) 516. During each cycle of the virtual clock 510, all emulated logic modules in the set of identical logic modules complete one cycle of operation in accordance with the original design. As described above, a virtual cycle is divided into N iteration cycles for N logic modules so that the shared logic elements can be used iteratively with the translated memory elements to emulate all logic modules within the set of logic modules.

Because each bit in a memory array is essentially the same as a flip-flop, it can be iteratively emulated with a shift register. Due to the large number of bits in a typical memory array, however, substituting each bit of a memory array with a shift register may result in an emulation resource shortage. In an alternative exemplary embodiment, one or more memory arrays are united into a larger memory array during the translation process such as illustrated in FIG. 6 rather than being replaced with shift registers. This may be accomplished by multiplying the number of bits in the memory array of a selected logic module by the number of logic modules and replacing the memory array with a larger memory array having the resultant number of bits.

In FIG. 6, assuming 16 logic modules (P0-P15) for emulation and each logic module has an 8-bit 2k-word (11-bit address) memory array (represented by memory arrays 600a-p), all the memory arrays 600 may be united into a larger 8-bit 32k-word (15-bit address) memory array 602. In other words, the united memory array 602 may effectively include 16 logical blocks, each block representing a memory array of a logic module. In this example, four additional address bits may be used to effectively partition the united memory array 602 into the 16 logical blocks. Each effective logical block may be selected cycle by cycle using an iteration cycle signal is counting up at every iteration cycle as shown in FIG. 5B. This is logically similar to a shift register, which shifts at each increment of the iteration cycle signal 514. A memory array may be implemented in memory arrays embedded within the configurable logic device and/or in external memory chips.

Replacing flip-flops with shift registers and uniting the memory arrays effectively collects the memory elements into denser memory devices. Collecting the individual memory elements into denser memory devices contributes to reducing the emulation resource costs.

FIGS. 7 and 8 depict exemplary techniques for implementing shift registers rather than using a shift register primitive in a configurable logic device such as an FPGA. FIG. 7 depicts a cascaded series of flip-flops (represented by flip-flops 700a-n) that function as a shift register. For each shift register, this technique uses the same number of flip-flops as the number of logic modules in the set of identical logic modules.

FIG. 8 depicts a ring buffer technique for implementing shift registers that uses a dual port memory 802. A read address (RA) specifies a reading location for a read port (DO) and a write address (WA) specifies a writing location for a write port (DI). The read port (DO) and the write port (DI) of the dual port memory 802 are assigned as an output port and an input port, respectively, of the shift register it is replacing. The read and write addresses are controlled by a read pointer (RP) variable and a write pointer (WP) variable, respectively. At every iteration cycle, the read and write pointer variables are incremented (e.g., with wrap around). The read pointer variable precedes the write pointer variable, e.g., by one. In this configuration, values written at the write port (DI) appear at the read port (DO) N cycles later and, thus, the dual port memory 802 functions as a shift register. Assuming 16 logic modules are being emulated, the read and write addresses each have 4 bits that increment by one bit per cycle from 0 to 15. Because the addressable elements of such a memory array are typically large, this method is suitable for emulation of large multiprocessor systems.

In an exemplary embodiment, the size and number of logic modules within the set of identical logic modules is considered during the selection of the technique used to implement shift registers. In addition, the type of resources may be considered. For example, in certain look-up table (LUT)-based FPGAs (such as Xilinx Virtex, Virtex-E, Virtex-II, and Virtex-II Pro series), a shift register may have a lower resource cost than cascaded flip-flops. A four (4)-input LUT is convertible to a 16-bit shift register. When the size of a logic module is relatively small and the number of logic modules is equal to or less than 16 (i.e., the typical number of bits in an LUT-based shift register), the LUT-based shift register primitives may be replaced with flip-flops. In this case, it is assumed that the sum of the contribution of the logic of a logic module to the number of LUTs and shift register primitives is smaller than the number of LUTs in the configurable logic device (e.g., an FPGA). If the number of logic modules exceeds 16, the size of each logic module should be reduced accordingly.

When the size of a logic module is relatively large and the number of logic modules is relatively small, the cascaded flip-flop approach may be used. The LUTs used for a logic module can extend up to the number of LUTs in the configurable logic device (e.g., FPGA). The number of flip-flops used for shift registers should be less than the number of flip-flops in the logic device. The number of logic modules may be limited to the maximum number of bits with which the cascaded flip-flops can form a shift register.

When the number of logic modules is very large, such that neither the LUT-based shift register approach nor the cascaded flip-flop approach can accommodate all the shift registers, the state bits may be implemented in embedded and/or external memory arrays.

Figure 9:
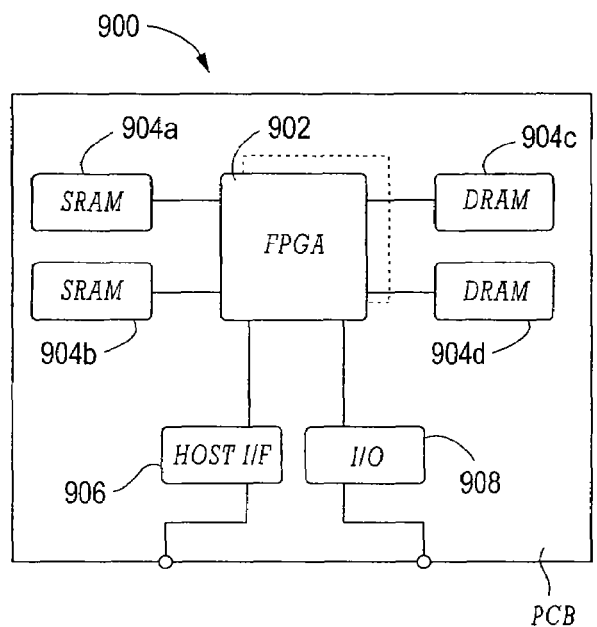
FIG. 9 is a block diagram of an exemplary configurable logic device apparatus in accordance with an aspect of the present invention.

FIG. 9 depicts an exemplary configurable logic device assembly 900 in accordance with an aspect of the present invention. The exemplary logic device assembly 900 includes a configurable logic device 902, at least one random access memory (RAM) device (represented by RAM devices 904a-d), a host interface 906, and an input/output (I/O) device 908. The illustrated configurable logic device 902 is an FPGA; and the illustrated at least one RAM device 904 includes a pair of static random access memory (SRAM 904a, b) and a pair of dynamic random access memory (DRAM 904c, d). The configurable logic device assembly 900 is particularly useful for Multiprocessor System On a Chip (MpSOC) designs or more general large logic system designs containing multiple functional modules and is able to support both logic design verification and system prototyping for early software development.

The SRAM and DRAM typically embedded in a logic circuit has the same density as current generation fabrication technology SRAM and DRAM chips. Thus, a small number of SRAM and DRAM chips on a circuit board should be sufficient to store all the on-chip memory components for all logic modules in a set of identical logic modules. The logic components of the logic modules and off-chip interfaces should fit into a single FPGA (or a few FPGAs), especially since logic modules (such as MpSOCs) use a number of identical logic modules and only a single copy of a logic module in each set of identical logic modules are used for emulation. Thus, a configurable logic device 900 such as depicted in FIG. 9 should have enough capacity for emulating current and next generation logic circuits.

Very large logic circuit designs may not fit into a single existing FPGA even under the iterative emulation scheme of the present invention. In this case, the logic circuit may be scaled down, divided into smaller logic circuits for separate emulation, and/or partitioned across multiple FPGAs.

The external SRAMs 904a, b may be assigned for the state bits or regular memory structures. In an exemplary embodiment, the SRAMs 904a, b hold most of the regular memory structures in the emulated architecture. Logic modules such as MpSOCs may have some large regular memory structures such as register files, local memories, cache memories, and communication buffers that cannot fit within the embedded memories in an FPGA. The contents of these memory structures may be stored in the external SRAMs 904a, b.

The external DRAMs 904c, d may be assigned for main memory. In large circuit designs they may also be assigned for the state bits or regular memory structures. The DRAMs 904c, d may be employed for higher memory capacity. When a logic device has main memory in DRAM, the configurable logic circuit assembly 900 may use the DRAMs 904c, d. For a very large MpSOC design, the external DRAMs 404c, d may also be used for the regular memory structures or for state bit storage.

When using the external SRAMs 904a, b and DRAMs 904c, d with the iterative emulation scheme of the present invention, data transfer into and out of the FPGA 902 should be optimized due to the relatively smaller number of I/O pins of a typical FPGA compared with typical data width requirements. On-chip SRAM blocks associated with each logic module typically have wide data buses that can be accessed every clock cycle. When these SRAM blocks are mapped onto external memory chips for emulation, the stored data for each logic module such as local memory belonging to each logic module may need to be transferred into and out of the FPGA during every virtual cycle. Due to the narrower off-chip interfaces on the FPGA, each such transfer may require additional clock cycles for multiplexing in addition to the regular iteration cycles. On the other hand, external DRAM usage for main memory in an MpSOC system and DRAM support on configurable logic devices are better matched in both data bus width and the number of clock cycles required for each read or write operation.

In an exemplary embodiment, the number of configurable logic devices 902 and memory components 904, and their sizes, is determined by matching the parameters of a target logic circuit with the logic and memory capacities of available configurable FPGAs and memory chips.

Figure 10:
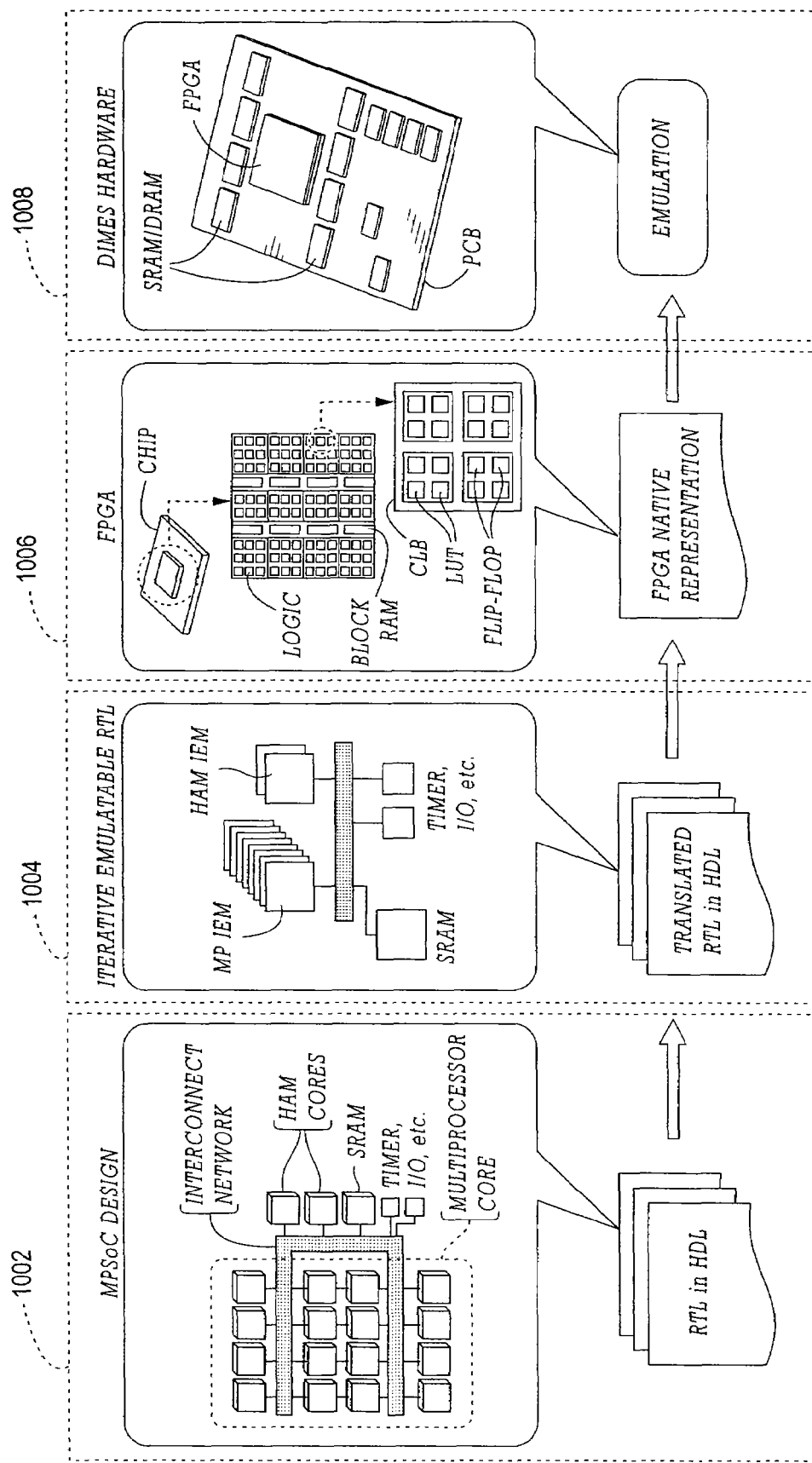
FIG. 10 is a flow diagram depicting an exemplary emulation flow in accordance with an aspect of the present invention.

FIG. 10 depicts an emulation workflow to illustrate cooperation between the hardware and software portions in preparing for an iterative emulation of a logic circuit (e.g., MpSOC) design. The depicted MpSOC design is a typical example including an interconnection network, a multiprocessor core, HAM cores such as DSPs or image processors, an SRAM block and miscellaneous functional blocks such as a timer and I/O devices. The design is usually written in an HDL for an ASIC implementation as depicted in block 1002. In the translation process, the original design is translated into an 'iterative emulatable' RTL representation as depicted in block 1004. The translated result consists mainly of three parts. The first part is a group of non-reduced blocks (i.e., blocks based on logic modules that do not correspond to any other logic modules). The second part is a group of significantly reduced blocks based on logic modules within sets of identical logic modules in accordance with an aspect of the present invention. This reduction is a significant advantage of the present invention and makes large-scale multiprocessor emulation in an FPGA possible. The third part is a large regular memory structure module which may be placed outside the configurable logic device.

Common electronic design automation (EDA) steps for FPGA implementation (e.g., synthesis and physical design flow) may be used to generate an FPGA native representation to configure the FPGA of the configurable logic device assembly 900 (FIG. 9) as depicted in block 1006. With the FPGA configured, the configured logic device assembly is used for emulation of the logic circuit design as depicted in block 1008. Host interface software controls the configured logic device and takes care of data communication between the configured logic device and a host system, for example.

In an exemplary embodiment, known FPGA optimization techniques are employed during the translation process. An MpSOC, for example, is typically designed for ASIC implementation. FPGA optimization techniques such as explicit use of tri-state buffers at a multiplexer, embedded memories, and clock distribution, however, may be applied to the MpSOC design for efficient emulation in the configurable logic device.

Figure 11A:
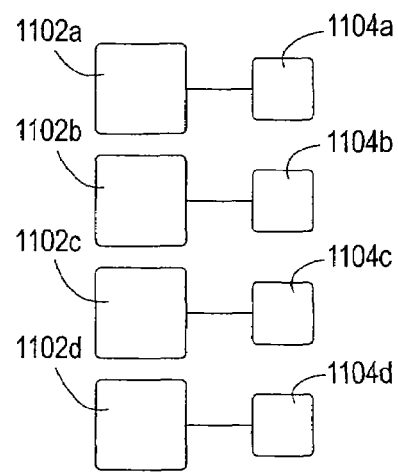
FIGS. 11A, 11B, and 11C are block diagrams depicting translation and unification of logic modules in accordance with an aspect of the present invention.
Figure 11B:
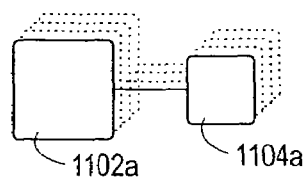
Figure 11C:
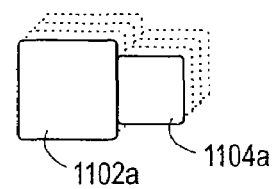

FIGS. 11A, 11B, and 11C depict unification of two sets of identical logic modules, each set having the same number of logic modules. If the original logic circuit design includes several sets of identical logic modules with different types, each having the same number of logic modules, and the logic modules of one set are connected to the logic modules of another set straightforwardly, they can be united into one logic module. In FIG. 11A, there are four processors (represented by processors 1002a-d) and four hardware acceleration modules (represent by hardware acceleration modules 'HAM' 1004a-d). A single processor module and a single HAM module can be extracted as shown in FIG. 11B and united as shown in FIG. 11C. Alternatively, they can be maintained separately.

Figure 12A:
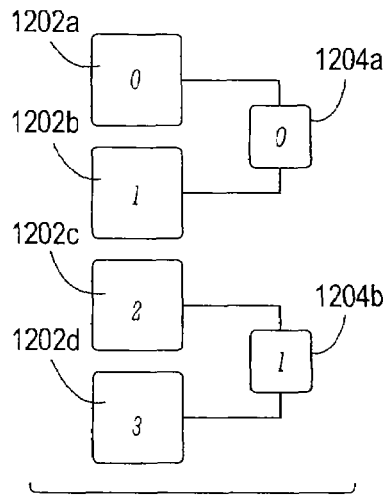
FIGS. 12A and 12B are block diagrams depicting translation of two sets of identical logic modules where each set has a different number of logic modules in accordance with an aspect of the present invention.
Figure 12B:
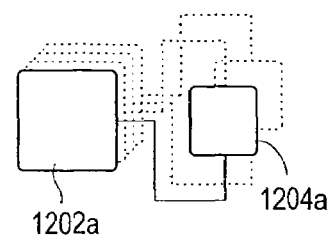
Figure 12C:
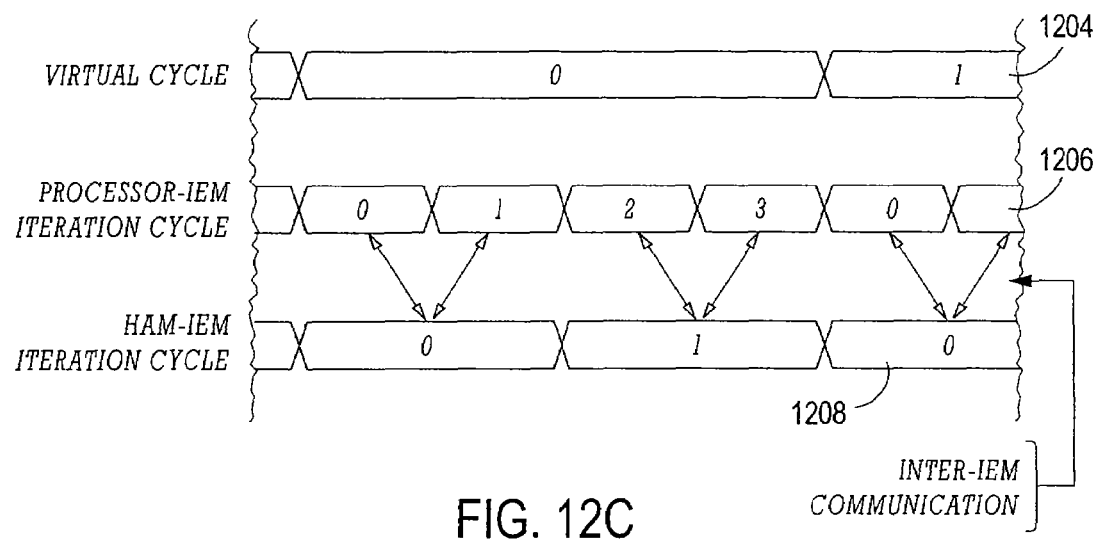
FIG. 12C is a timing diagram depicting communication between the two sets of identical logic modules of FIGS. 12A and 12B.

FIG. 12A depicts two sets of identical logic modules, each set having a different number of logic modules. Due to the different number of logic modules in each set, each set may have a different number of iteration cycles. In FIG. 12A, there are four processor modules (represented by processors 1202a-d) and two HAM modules (represented by HAM modules 1204a, b). A single processor module and HAM module can be extracted as shown in FIG. 12B. FIG. 12C depicts a timing diagram depicting cycles for the two sets of identical logic modules having a different number of iterations. The timing diagram includes a virtual cycle signal 1204, a processor iteration cycle signal 1206, and a HAM module cycle signal 1208. Arrows between the processor iteration cycle signal 1206 and the HAM iteration cycle signal 1208 indicate inter-logic module communication. Data exchange between these two logic modules may be coordinated to take place during a virtual cycle when all the necessary data for communication from the two IEMs have been generated to enable concurrent emulation.

In an exemplary embodiment, to minimize the number of clock sources for use with synchronous circuits in an FPGA, the clock signal with the highest clock frequency is chosen among the clock signals of different frequencies for required iteration cycles, and the other signals are converted to load enable signals that practically determine whether every flip-flop loads a value or not. This helps to produce stable and efficient synthesized result.

Figures 13A, 13B:
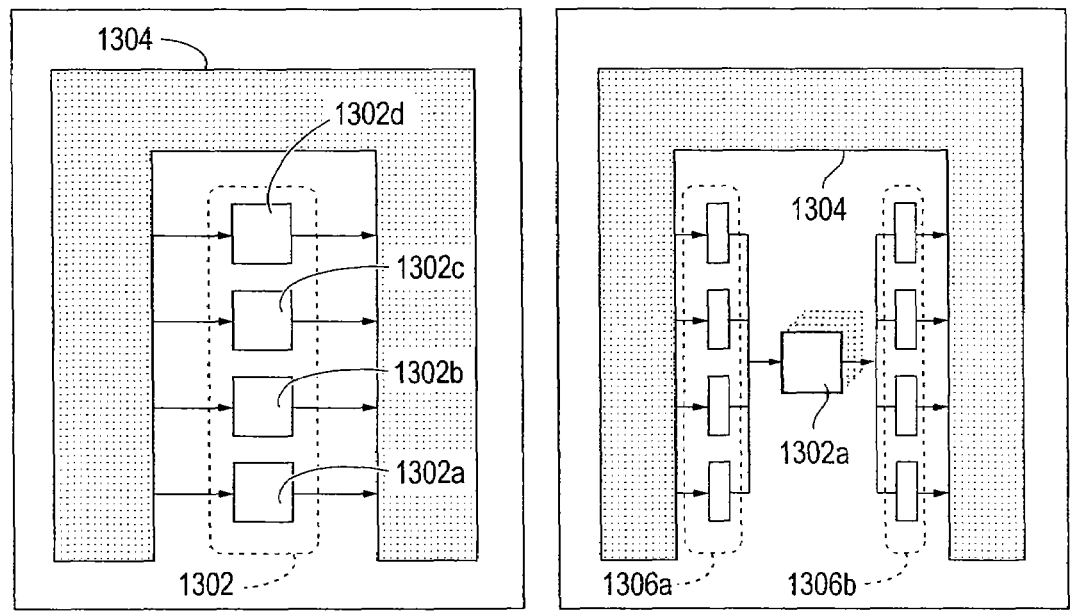
FIGS. 13A and 13B are block diagrams depicting translation of a set of identical logic modules connected to non-iterative logic in accordance with an aspect of the present invention.

FIGS. 13A and 13B depict a set of identical logic modules 1302 surrounded by non-iteratively emulated logic circuits 1304 before and after translation, respectively. In applying the iterative emulation scheme to a specific logic device design such as an MpSOC, interface registers (represented by serializing interface registers 1306a and deserializing interface registers 1306b) may be placed between a single translated logic module 1302a and the logic circuits 1304 with which it communicates. The serializing interface registers 1306a serialize data transmitted to the logic module 1302a and the deserializing interface registers 1306b deserialize data transmitted from the logic module 1302a. An interface register is not needed for a last iteration of the set of logic modules in practice because the data for the corresponding logic module can pass directly without an interface register as soon as the data is ready. Interface registers may also be employed for data transferred between sets of identical logic modules where each set has different number of logic modules and, thus, iterations during a virtual cycle.

Although the invention is illustrated and described herein with reference to specific embodiments, the invention is not intended to be limited to the details shown. For example, although described above with reference to a single integrated circuit emulated using a single emulation resource, the present invention may be applied to multiple chips by applying iterative emulation to inter-chip level and intra-chip level recursively and extending memory capacity as needed. Various other modifications may be made in the details within the scope and range of equivalents of the claims and without departing from the invention.

What is claimed:

1. A method for emulating a logic circuit having at least one set of identical logic modules, the method comprising the steps of:
   (a) extracting a logic module from a set of identical logic modules within the logic circuit, each identical logic module in the identified set having at least one logic element and at least one memory element that stores a module state of that identical logic module;
   (b) translating the extracted logic module for iterative representation of the module state of each of the identical logic modules with a single instance of the at least one logic element; and
   (c) configuring a logic device with the translated logic module to emulate the logic circuit.

2. The method of claim 1, wherein the logic device is configured such that the iterative representation of the module state of each of the identical logic modules is iteratively combined with the single instance of the at least one logic element to emulate the logic circuit.

3. The method of claim 1, wherein the logic circuit includes at least two sets of identical logic modules, the method further comprising the step of:
   (d) repeating steps a-b for another set of identical logic modules before configuring the logic device.

4. The method of claim 1, wherein the at least one set of identical logic modules includes a first set of identical logic modules and a second set of identical logic modules, and wherein the translating step comprising:
   uniting the first and second sets of identical logic modules.

5. The method of claim 1, wherein the at least one set of identical logic modules includes a first set of identical logic modules having a first number of logic modules and a second set of identical logic modules having a second number of logic modules, the first and second numbers of logic modules being different, and wherein the translating step comprises:
   creating registers between the first and second sets of identical logic modules to enable communication therebetween.

6. The method of claim 1, wherein the at least one memory element includes a memory array and wherein the translating step comprises the step of:
   uniting the at least one memory arrays of each of the logic modules in the set of identical logic modules.

7. The method of claim 1, wherein the logic circuit further includes at least one non-identical logic module and wherein the translating step further comprises the step of:
   creating registers between the set of identical logic modules and the at least one non-identical logic module.

8. The system of claim 1, wherein the at least one memory element includes a memory array and wherein the translating means comprises:
   means for uniting the at least one memory arrays of each of the logic modules in the set of identical logic modules.

9. A method for emulating a logic circuit having at least one set of identical logic modules, the method comprising the steps of:
   (a) extracting a logic module from a set of identical logic modules within the logic circuit, each identical logic module in the identified set having at least one logic element and at least one memory element that stores a module state of that identical logic module;
   (b) translating the extracted logic module for iterative representation of the module state of each of the identical logic modules with a single instance of the at least one logic element; and
   (c) configuring a logic device with the translated logic module to emulate the logic circuit; and
   wherein the at least one memory element includes at least one flip-flop and wherein the translating step comprises replacing the at least one flip-flop with a shift register, wherein adjacent bits within the shift register correspond to different iterations representing the module state of different logic modules.

10. The method of claim 9, wherein the configuring step comprises the steps of:
representing the shift register with a series of flip flops in the logic device.

11. The method of claim 9, wherein the configuring step comprises the steps of:
representing the shift register with a dual port memory ring buffer in the logic device.

12. A system for emulating a logic circuit having at least one set of identical logic modules, the system comprising:
means for extracting a logic module from a set of identical logic modules within the logic circuit, each identical logic module in the identified set having at least one logic element and at least one memory element that stores a module state of that identical logic module;
means for translating the extracted logic module for iterative representation of the module state of each of the identical logic modules with a single instance of the at least one logic element; and
means for configuring a logic device with the translated logic module to emulate the logic circuit.

13. The system of claim 12, wherein the at least one set of identical logic modules includes a first set of identical logic modules and a second set of identical logic modules, and wherein the translating means comprises:
means for uniting the first and second sets of identical logic modules.

14. The system of claim 12, wherein the at least one set of identical logic modules includes a first set of identical logic modules having a first number of logic modules and a second set of identical logic modules having a second number of logic modules, the first and second numbers of logic modules being different, and wherein the translating means comprises:
means for creating registers between the first and second sets of identical logic modules.

15. The system of claim 12, wherein the at least one memory element includes at least one flip-flop and wherein the translating means comprises:
means for replacing the at least one flip-flop with a shift register, wherein adjacent bits within the shift register correspond to different iterations representing the module state of different logic modules.

16. A configurable logic device assembly capable of emulating a logic circuit having at least one set of identical logic modules, each logic module having at least one logic element and at least one memory element, the assembly comprising:
a configurable logic device configured for iterative representation of a first portion of the module state of each of the identical logic modules with a single instance of the at least one logic element; and
at least one random access memory device coupled to the configurable logic device, the at least one random access memory device configured to store a second portion of the module state of each of the identical logic modules for iterative representation with the single instance of the at least one logic element.

17. The assembly of claim 16, further comprising:
a host interface coupled to the configurable logic device; and
an input/output (I/O) interface coupled to the configurable logic device.

18. The assembly of claim 16, wherein the configurable logic device is a field programmable gate array (FPGA).

19. The assembly of claim 16, wherein the at least one random access memory device comprises:
at least one static random access memory (SRAM) coupled to the configurable logic device; and
at least one dynamic random access memory (DRAM) coupled to the configurable logic device.

* * * * *